United States Patent [19]

Chwang

[11] Patent Number: 4,613,886

[45] Date of Patent: Sep. 23, 1986

[54] CMOS STATIC MEMORY CELL

[75] Inventor: Ronald J. C. Chwang, Beaverton, Oreg.

[73] Assignee: Intel Corporation, Santa Clara, Calif.

[21] Appl. No.: 808,655

[22] Filed: Dec. 13, 1985

Related U.S. Application Data

[63] Continuation of Ser. No. 590,896, Mar. 19, 1984, which is a continuation of Ser. No. 281,709, Jul. 9, 1981, abandoned.

[51] Int. Cl.[4] ...................... H01L 27/02; H01L 29/78
[52] U.S. Cl. .................... 357/42; 357/23.11; 357/52; 357/59; 365/154; 365/156; 365/188
[58] Field of Search ................. 357/23.11, 42, 52, 59; 365/154, 156, 188

[56] References Cited

U.S. PATENT DOCUMENTS

| | | | |
|---|---|---|---|
| 4,035,826 | 7/1977 | Morton et al. | 357/42 |
| 4,047,284 | 9/1977 | Spadea | 357/42 |
| 4,282,648 | 8/1981 | Yu et al. | 357/42 |
| 4,295,897 | 9/1981 | Tubbs et al. | 357/42 |
| 4,458,262 | 8/1984 | Chao | 357/42 |
| 4,481,524 | 11/1984 | Tsujide | 365/156 |

OTHER PUBLICATIONS

Dingwall et al., I.E.D.M., Wash. D.C., Dec. 4, 5, 6, 1978, pp. 193-196.

Primary Examiner—Martin H. Edlow
Assistant Examiner—Jerome Jackson, Jr.
Attorney, Agent, or Firm—Blakely, Sokoloff, Taylor & Zafman

[57] ABSTRACT

A CMOS static memory cell comprising a bistable circuit is described. A grounded p-type region separates the p-channel transistors of the circuit from the n-channel transistors. This p-type region reduces latch up problems and permits polysilicon lines to be routed over the region. The resultant memory cell is of higher density than prior art cells.

6 Claims, 9 Drawing Figures

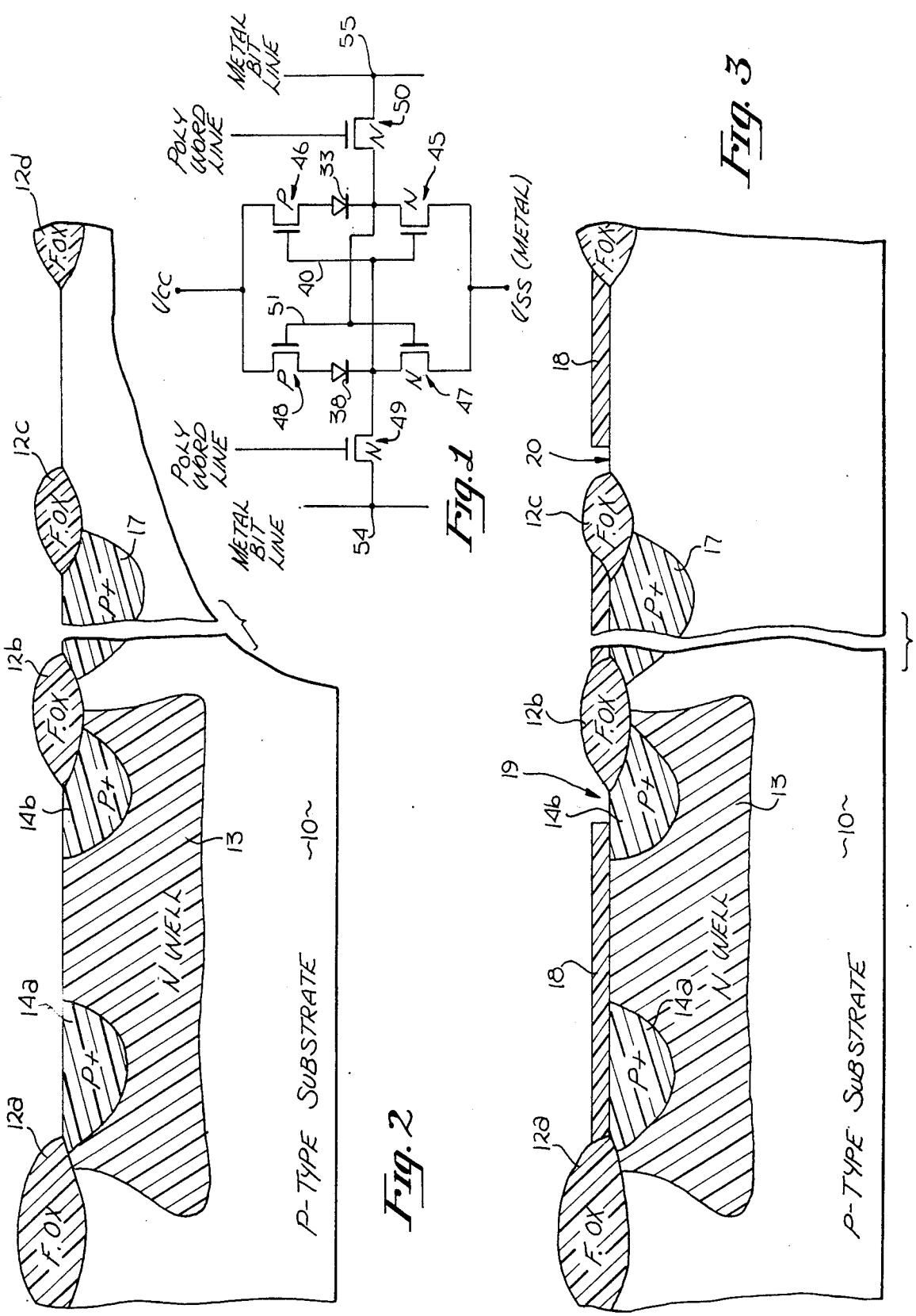

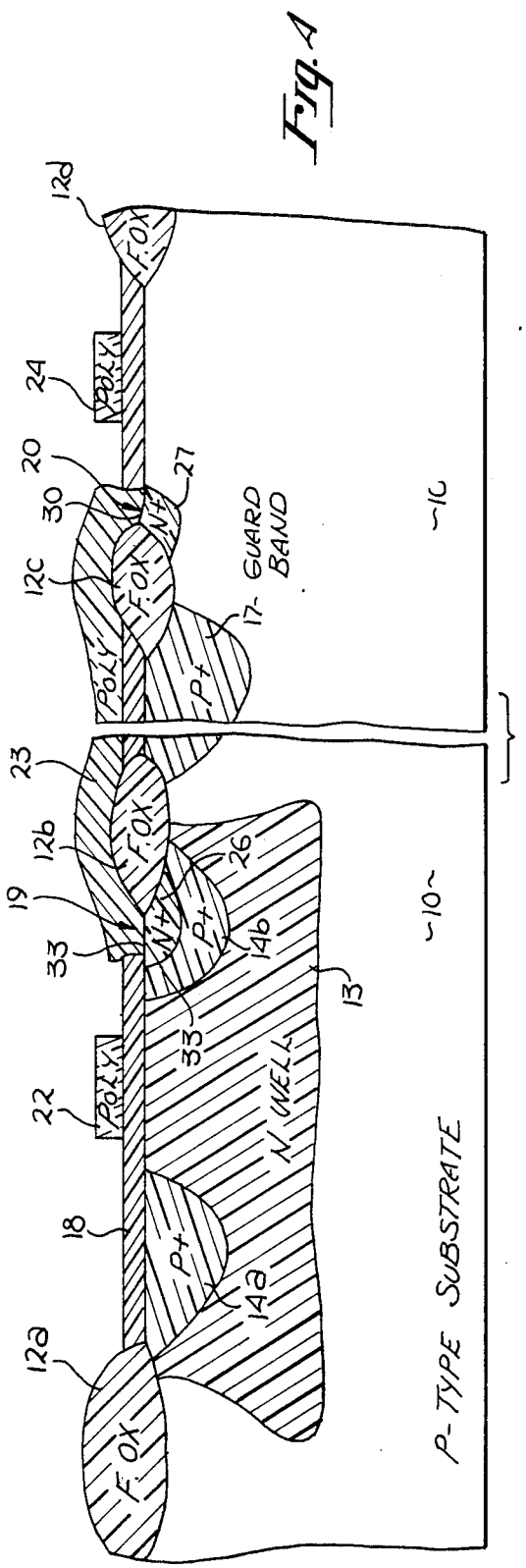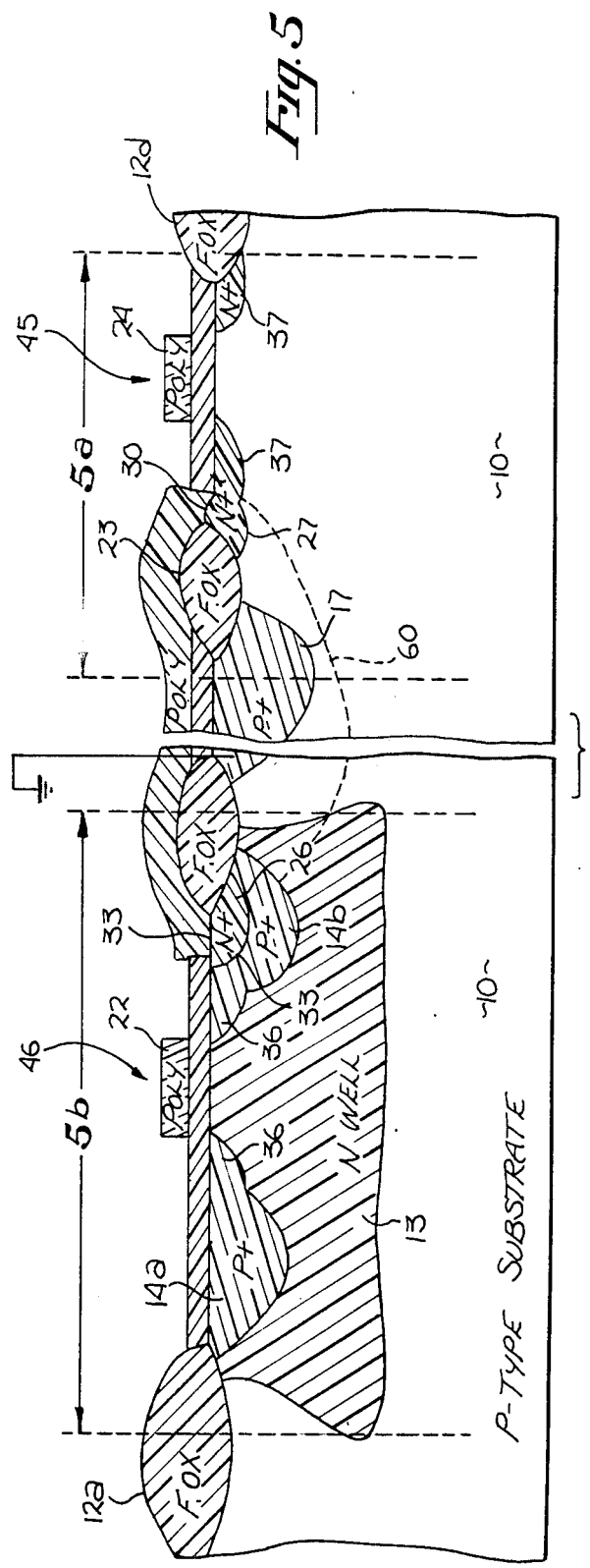

CMOS STATIC MEMORY CELL

This is a continuation of application Ser. No. 590,896 filed Mar. 19, 1984 which was a continuation of application Ser. No. 281,709 filed July 9, 1981 which is now abandoned.

BACKGROUND OF THE INVENTION

1. Field of the Invention

The invention relates to the field of complementary metal-oxide-semiconductor (CMOS) circuits, particularly memory cells.

2. Prior Art

Complementary metal-oxide-semiconductor (CMOS) integrated circuits are well-known and widely used. Recently, this technology has become more widely used and accepted since CMOS circuits have a high immunity to "soft failures" (that is, failures associated with ionized particles traveling through the substrate). CMOS circuits have other advantages such as lower power consumption and higher noise immunity over a wide range of power supply voltages, when compared to other MOS technologies.

A CMOS process is described in copending application Ser. No. 133,580 filed Mar. 24, 1980 and entitled "CMOS Process", which application is assigned to the assignee of the present application. This process with modifications, as will be described, is used to fabricate the memory cell of the present invention. This copending application and the memory cell shown in FIG. 10 of the application represents the closest prior art known to Applicant.

As will be seen, the present invention utilizes a well-known bistable circuit (flip-flop), however, with other regions and in a unique layer to provide a memory cell which may be fabricated more densely than prior art cells and which has a higher immunity to CMOS latch-up.

The latch-up problem is a well-known problem which will be discussed in more detail in conjunction with FIG. 5. In general, CMOS circuits include transistor-like structures with adjacent NPN or PNP regions. Parasitic transistor action can occur, causing short circuits which literally destroy the CMOS circuit. A uniquely placed p-region in the present invention reduces this latch-up problem.

SUMMARY OF THE INVENTION

A complementary metal-oxide-semiconductor (CMOS) static memory cell which is formed on a silicon substrate is described. This cell includes in each of its legs, an n-channel transistor and a p-channel transistor. A polysilicon member interconnects the source region of one of these transistors with the drain region of the other of the transistors. A p-type region is formed in the substrate disposed between the transistors with the polysilicon member crossing this p-type region. Grounding means are used for coupling the p-type region to a predetermined potential such as ground potential. The use of the polysilicon member with its crossing over the p-type region enables the cell to be fabricated on a relatively small substrate area. A latch-up path which includes the n-well in which the p-channel transistor is fabricated, the p-type substrate and the drain of the n-channel transistor could present a significant problem. However, the p-type region reduces the lateral beta associated with this path and also the path's resistance. This lessens the possibility of substrate current conduction along this path to initiate latch-up.

BRIEF DESCRIPTION OF THE DRAWINGS

FIG. 1 is an electrical schematic of a bistable circuit known in the prior art.

The process described in FIGS. 2-5 is used to fabricate the invented memory cell.

FIG. 2 is a cross-sectional elevation view of a substrate which includes field oxide regions, an n-well and p-type regions.

FIG. 3 illustrates the substrate of FIG. 2 after openings have been formed through an oxide layer.

FIG. 4 illustrates the substrate of FIG. 3 after a polysilicon layer has been formed on the substrate and after this layer has been patterned.

FIG. 5 illustrates the substrate of FIG. 4 after additional doping steps.

Figures 6, 7:
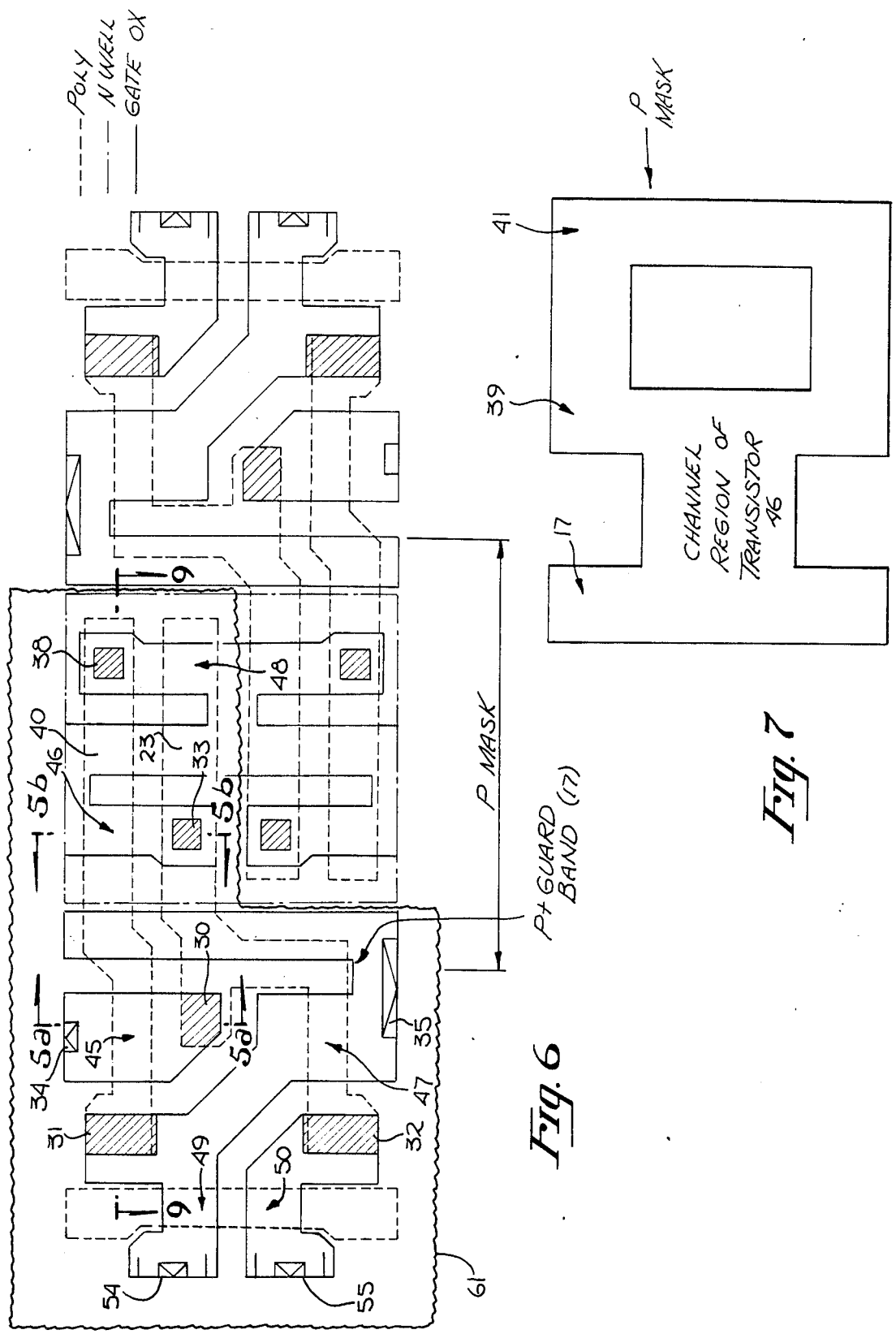

FIG. 6 is a plan view illustrating the layout of the invented memory cell.

FIG. 7 is a plan view of a mask used in the fabrication of the memory cell of FIG. 6.

Figure 8:
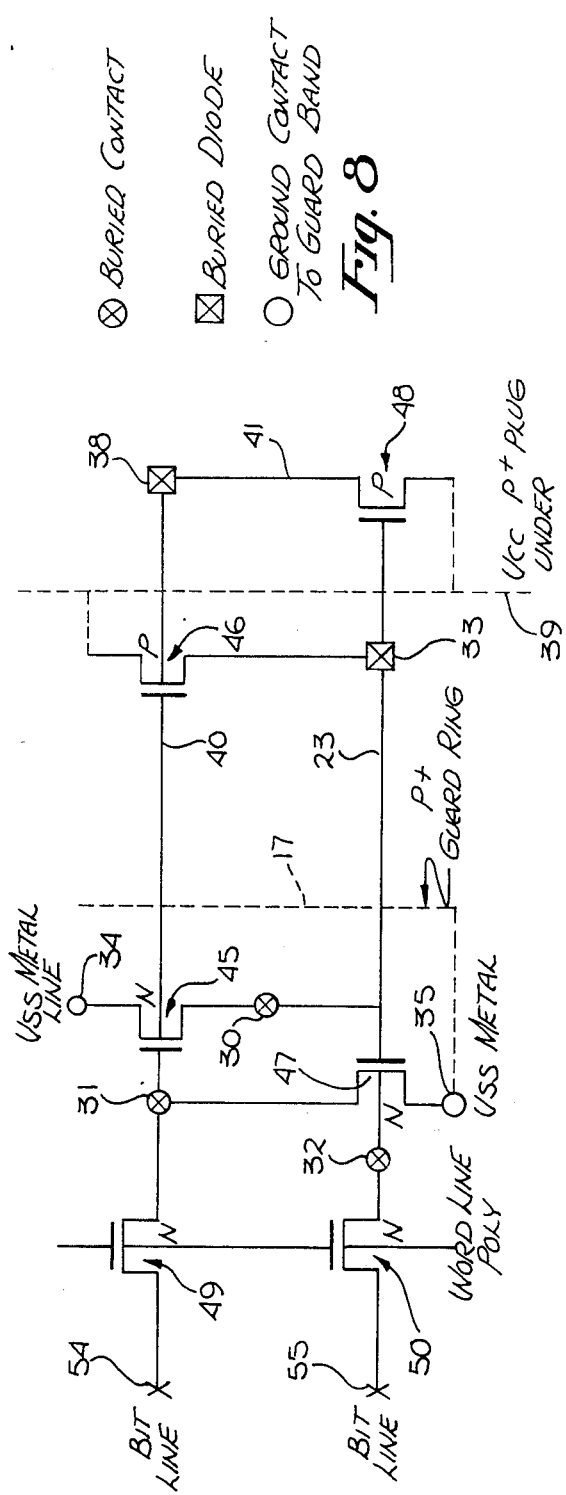

FIG. 8 is an equivalent circuit for the memory cell of FIG. 6.

Figure 9:
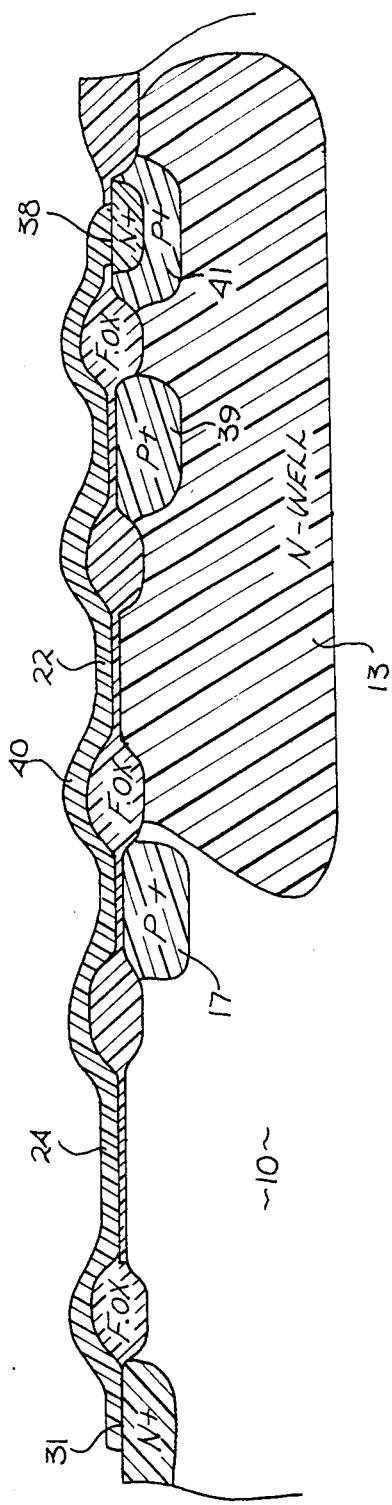

FIG. 9 is a cross-sectional elevation view of the memory cell of FIG. 6 generally taken section line 9—9 of FIG. 6.

DETAILED DESCRIPTION OF THE INVENTION

A complementary metal-oxide-semiconductor (CMOS) static memory cell is described along with the process for fabricating the cell. In the following description, numerous specific details are set forth such as specific thicknesses, etc. in order to provide a thorough understanding of the present invention. However, it will be obvious to one skilled in the art that the present invention may be practiced without these specific details. In other instances, well-known structures and processes have not been described in detail in order not to obscure the present invention in unnecessary detail.

Referring first to FIG. 1, a well-known bistable circuit which is used as a memory cell is illustrated. This CMOS circuit includes two cross-coupled branches, each branch includes a p-channel transistor and an n-channel transistor coupled in series with a diode. Specifically, transistors 45 and 46 are cross coupled through line 40 and transistors 47 and 48 are cross coupled through line 51. Diode 33 is in series with the transistors 45 and 46 and similarly, diode 38 is in series with transistors 47 and 48. The node between diode 38 and transistor 47 is coupled to a bit line at contact 54 through transistor 49, and similarly, the node between diode 33 and transistor 45 is coupled to a complementary bit line at contact 55 through transistor 50.

With the present invention, the cell of FIG. 1 including additional regions such as a p-type region used to reduce latch-up is laid-out in a unique manner to permit dense fabrication. The topographical layout is illustrated in FIG. 6 with the equivalent circuit for the layout of FIG. 6 shown in FIG. 8. The same numbers used in FIG. 1 have again been used in FIG. 8; a comparison of FIGS. 1 and 8 will show that the circuits of these figures are equivalent.

The series transistors in each leg of the bistable circuit such as transistors 45 and 46 with the intermediate diode 33 are arranged in a novel manner with the present invention. The process for fabricating these transistors is described in conjunction with FIGS. 2-5. For purposes of explanation, these transistors are shown fabricated side-by-side on the substrate 10. In actuality as will be seen from FIG. 6, these transistors are parallel to one another. For this reason, a break is shown in the substrate 10 at region 17.

An ordinary p-type monocrystalline silicon substrate 10 is used for the fabrication of the invented memory circuit. During initial processing steps, the field oxide regions 12a–12d of FIG. 2 are fabricated along with an n-type well 13. P-type regions 14a and 14b are formed within the n-well 13 and importantly, an additional p-type region 17 is formed between the field oxide regions 12b and 12c simultaneously with the doping of regions 14a and 14b. While not shown in FIG. 2, channel stop regions are fabricated beneath the field oxide regions. The processing used for forming the field oxide regions, the underlying channel stops, n-well and p-type regions of FIG. 2 is described in the abovementioned copending application, Ser. No. 133,580, filed Mar. 24, 1980.

Next, a gate oxide layer 18 as shown in FIG. 3 is formed on the substrate. In the presently preferred embodiment, this layer is approximately 400 A thick. Using ordinary masking and etching steps, openings 19 and 20 are formed in this layer adjacent to the oxide regions 12b and 12c, respectively. A polycrystalline silicon (polysilicon) layer is formed over the substrate and patterned, using ordinary photolithographic techniques. The polysilicon member 23 and the polysilicon gates 22 and 24 are thus formed as shown in FIG. 4. (In actuality, gates 22 and 24 are part of the same elongated polysilicon strip.)

The polysilicon layer prior to its patterning, is heavily doped with an n-type dopant. The polysilicon member 23 extends into the openings 19 and 20. The n-type dopant from this member diffuses into region 14b forming region 26. Thus, a buried contact 33 (that is, a contact between the polysilicon member and substrate) is formed in addition to a diode 33 at the junction of regions 26 and 14b. Another buried contact 30 is formed at the other end of member 23 where this member contacts the substrate and forms region 27.

Two separate masking and doping steps are now used to complete the source and drain regions for transistors 45 and 46 as shown in FIG. 5. First, transistor 46 is covered with a photoresist and then an n-type dopant implanted in alignment with the gate 24 to form regions 37. Transistor 45 is next covered, leaving transistor 46 exposed, to allow a p-type dopant to be implanted in alignment with gate 22 to form regions 36.

In the presently preferred embodiment, regions 14a, 14b, and the p-type guardband region 17 are formed with a boron dopant either by ion implantation or with an ordinary diffusion step. Boron is implanted to a level of $1 \times 10^{14}/cm^2$ to form the regions 36. An arsenic implant is used to form regions 37; ions are implanted to a level of $5 \times 10^{15}/cm^2$.

The remaining processing used to complete transistors 45 and 46 is well-known and thus not shown. It includes formation of passivation layers and metallization.

As is well-known, the various doped regions in a CMOS circuit form transistor-like structures. Care must be taken in the use of these circuits to prevent current flow through these transistor-like structures, since otherwise, the integrated circuit can be damaged or destroyed. Current flow through these parasitic paths is commonly referred to as "latch-up", and such latch up represents one of the major drawbacks to the use of many CMOS circuits.

In the structure of FIG. 5, one path which provides a transistor-like structure is shown along dotted line 60. The n-type region of the n-well 33, the p-type region of the substrate and the n-type region 37 form an npn transistor. Should conduction occur through this transistor, the integrated circuit would be destroyed. To reduce the possibility of such conduction, the p-type region 17 which acts as a guardband is formed in the substrate as shown, and this region is coupled to a predetermined potential, particularly to ground. Region 17 reduces the lateral beta in the substrate region of this transistor; that is, in the "base" of the transistor. Moreover, since region 17 is coupled to ground, it reduces the resistance along path 60, further reducing the chance of latch up due to parasitic current along path 60.

Referring now to FIG. 6, the memory cell of FIG. 8 is shown within the line 61. The memory cells in the array are interlaced and as can be seen the area defined by line 61 is not rectangular in shape. As presently implemented, the area required for each cell is approximately 2.7 mil 2.

In FIG. 6, the polysilicon members are shown with a dashed line, the n-type well in which the p-channel transistors are formed is a dashed line broken with dots, and the outline of the gate oxide regions is a solid line. The legend for these lines is shown to the right of FIG. 6.

Transistors 49 and 50 are easily identified in FIG. 6. Substrate regions of these transistors are coupled to overlying metal lines not shown. One region of transistor 49 is connected to one metal line through the contact 54, and one region of transistor 50 is connected through contact 55 to the other metal line. The gates of transistors 49 and 50 are defined by an elongated polysilicon strip. This strip runs generally perpendicular to the metal bit lines.

The cell includes two generally parallel elongated polysilicon lines 23 and 40. The line 40 extends from the buried contact/diode 38 to the buried contact 31. This line includes the gates 22 and 24 of FIG. 5. The transistor 45 is disposed along this line and its placement can be seen by the section line 5a—5a. Similarly, the transistor 46 is disposed along the polysilicon line 40 and its placement along the line can be seen by the cross-sectional line 5b—5b. One terminal of transistor 46 is connected by the buried contact/diode to the other polysilicon line 23. Similarly, one terminal of the transistor 45 is connected to the line 23 at buried contact 30. The other polysilicon line 23 includes an offset section for transistor 47. One terminal of this n-channel transistor is connected to line 23 at the buried contact 32.

The p-type region 17 is connected to an overlying metal line which is grounded at contact 35. This contact also couples one terminal of transistor 47 to ground. A contact 34 is used to connect one terminal of transistor 45 to another overlying metal line which is also grounded. It should be noted that the P+ guardband is connected to the same metal line which provides the ground to the n-channel side of this memory cell. This results in a very effective strapping of the guardband and a very dense cell due to shaving of the same metal line.

The fabrication of the cell of FIG. 6 proceeds with the steps shown in FIGS. 2-5. The mask used to define the p-type regions including the important guardband region 17 of FIG. 2 is shown in FIG. 7. The alignment of this mask on FIG. 6 is shown by the dimension "p-mask" in FIG. 6. The left hand portion of the p-mask defines the region 17. The indentation of the upper portion of the mask (where no p-type dopant is diffused) permits the formation of the p-channel transistor in the n-well.

Referring now to the cross-sectional view of FIG. 9, the elongated polysilicon line 40 can be seen clearly. One end of this line terminates at contact 38 while the other end at contact 31. The gates 22 and 24 are also shown. The region 39 is coupled to $V_{CC}$ and provides a positive potential to the two p-channel transistors. The region 41 provides coupling from one terminal of transistor 48 to the line 40. The portions of the p-mask of FIG. 7 which permit doping of regions 39 and 41 and the P+ guard ring 17 are indicated in FIG. 7.

Thus, a memory cell has been described which includes a bistable (flip-flop) circuit. A p-type region disposed through the circuit minimizes the possibilities of parasitic current through a transistor-like structure formed in the circuit. This p-type region, since it is coupled to ground, permits polysilicon members to be routed directly over the region. This permits a denser circuit to be fabricated.

I claim:

1. A complementary metal-oxide-semiconductor static memory cell formed on a substrate where first insulative regions are used for field insulation and a second thinner insulative layer for insulating channel regions of field effect transistors from overlying gates, comprising:

a first p-type region disposed in said substrate covered with said thinner insulative layer;

an n-type well disposed in said substrate where said well is physically separated from said p-type region, said well covered with said thinner insulative layer;

a grounding line for coupling said p-type region to a predetermined potential;

a contact for connecting said p-type region with said grounding line disposed through said thinner insulative layer;

first and second generally parallel, spaced-apart, elongated polysilicon members, said members crossing said first p-type region;

a first p-channel transistor disposed on a first side of said first p-type region, wherein said first p-channel transistor is formed by two p-type areas disposed in said n-well and said first polysilicon member is disposed above said n-well and defines the gate of said first p-channel transistor;

a second p-channel transistor disposed on said first side of said first p-type region, wherein said second p-channel transistor is formed by two p-type areas disposed in said n-well and said second polysilicon member is disposed above said n-well and defines the gate of said second p-channel transistor;

a first n-channel transistor disposed on an opposite side of said first side of said first p-type region, wherein said first n-channel transistor is formed by two n-type areas disposed in said substrate and said first polysilicon member disposed above said substrate defines the gate of said first n-channel transistor, source region of said first n-channel transistor being coupled to said grounding line;

a second n-channel transistor disposed on said opposite side of said first p-type region, wherein said second n-channel transistor is formed by two n-type areas disposed in said substrate and said second polysilicon member disposed above said substrate defines the gate of said second n-channel transistor, source region of said second n-channel transistor being coupled to said grounding line;

a first diode formed by disposing n-type material in one of two p-type areas of said first p-channel transistor;

a second diode formed by disposing n-type material in one of two p-type areas of said second p-channel transistor;

said first and second p-channel transistors, and said first and second n-channel transistors being formed subsequent to said p-type region, said p-type region disposed at greater depth than said transistors;

said contact for connecting said p-type region and said grounding line also making contact between one of said source regions of said n-channel transistors and said grounding line;

coupling means for coupling said first and second p-channel transistors and said first and second n-channel transistors to form a bistable circuit, said coupling means including a third polysilicon member for coupling said first polysilicon member to the drain terminal of said second n-channel transistor and cathode of said second diode, a fourth polysilicon member for coupling said second polysilicon member to the drain terminal of said first n-channel transistor and cathode of said first diode;

whereby latch-up problems are reduced and a denser memory cell is realized.

2. The static memory cell defined by claim 1 wherein said second polysilicon member includes an off-set section along which said second n-channel transistor is formed.

3. The static memory cell defined by claim 2 wherein said third polysilicon member is integral with said first polysilicon member and wherein said fourth polysilicon member is integral with said second polysilicon member.

4. The static memory cell defined by claim 3 wherein other of two p-type areas of said first and second p-channel transistors are coupled to a positive potential relative to said predetermined potential.

5. The static memory cell defined by claim 4 wherein one end of said first and second polysilicon members terminate in one terminal of third and fourth n-channel transistors, respectively.

6. The static memory cell defined by claim 5 including a second p-type region generally parallel to said first p-type region and spaced-apart from said first p-type region, said second p-type region being disposed between said first and second p-channel transistors and being coupled to said other of said two p-type areas of said p-channel transistors for providing said positive potential to said p-channel transistors.

* * * * *